(12) United States Patent
Belostotskiy et al.

(10) Patent No.: US 8,580,693 B2
(45) Date of Patent: Nov. 12, 2013

(54) TEMPERATURE ENHANCED ELECTROSTATIC CHUCKING IN PLASMA PROCESSING APPARATUS

(75) Inventors: Sergey G. Belostotskiy, Sunnyvale, CA (US); Michael G. Chafin, Santa Clara, CA (US); Jingbao Liu, Sunnyvale, CA (US); David Palagashvili, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 143 days.

(21) Appl. No.: 13/080,561

(22) Filed: Apr. 5, 2011

(65) Prior Publication Data

US 2012/0052690 A1  Mar. 1, 2012

Related U.S. Application Data

(60) Provisional application No. 61/377,852, filed on Aug. 27, 2010.

(51) Int. Cl.
*H01L 21/3065* (2006.01)
*C23F 1/00* (2006.01)

(52) U.S. Cl.
USPC ............ 438/715; 156/345.24; 156/345.27; 257/E21.218

(58) Field of Classification Search
None
See application file for complete search history.

(56) References Cited

U.S. PATENT DOCUMENTS

| | | | |
|---|---|---|---|
| 5,684,669 A * | 11/1997 | Collins et al. | 361/234 |
| 5,818,682 A * | 10/1998 | Loo | 361/234 |
| 5,874,361 A * | 2/1999 | Collins et al. | 438/716 |
| 6,030,666 A * | 2/2000 | Lam et al. | 427/539 |
| 6,125,025 A * | 9/2000 | Howald et al. | 361/234 |
| 6,790,375 B1 * | 9/2004 | Howald et al. | 216/67 |
| 6,965,506 B2 * | 11/2005 | Howald | 361/234 |
| 7,156,951 B1 * | 1/2007 | Gao et al. | 156/345.53 |
| 7,196,896 B2 * | 3/2007 | Howald et al. | 361/234 |
| 7,416,793 B2 * | 8/2008 | Matsuda et al. | 428/701 |
| 7,772,098 B2 * | 8/2010 | Kusumoto et al. | 438/522 |
| 2002/0048311 A1 * | 4/2002 | Norrbakhsh et al. | 374/141 |
| 2003/0038114 A1 * | 2/2003 | Howald | 216/67 |
| 2005/0036268 A1 * | 2/2005 | Howald et al. | 361/234 |
| 2005/0152089 A1 * | 7/2005 | Matsuda et al. | 361/234 |
| 2006/0213900 A1 * | 9/2006 | Matsuda et al. | 219/444.1 |
| 2008/0186647 A1 * | 8/2008 | Kawajiri et al. | 361/234 |

* cited by examiner

*Primary Examiner* — Allan Olsen
(74) *Attorney, Agent, or Firm* — Blakely, Sokoloff, Taylor & Zafman LLP

(57) ABSTRACT

Methods and systems for temperature enhanced chucking and dechucking of resistive substrates in a plasma processing apparatus are described herein. In certain embodiments, methods and systems incorporate modulating a glass carrier substrate temperature during a plasma etch process to chuck and dechuck the carrier at first temperatures elevated relative to second temperatures utilized during plasma etching. In embodiments, one or more of plasma heat, lamp heat, resistive heat, and fluid heat transfer are controlled to modulate the carrier substrate temperature between chucking temperatures and process temperatures with each run of the plasma etch process.

19 Claims, 8 Drawing Sheets

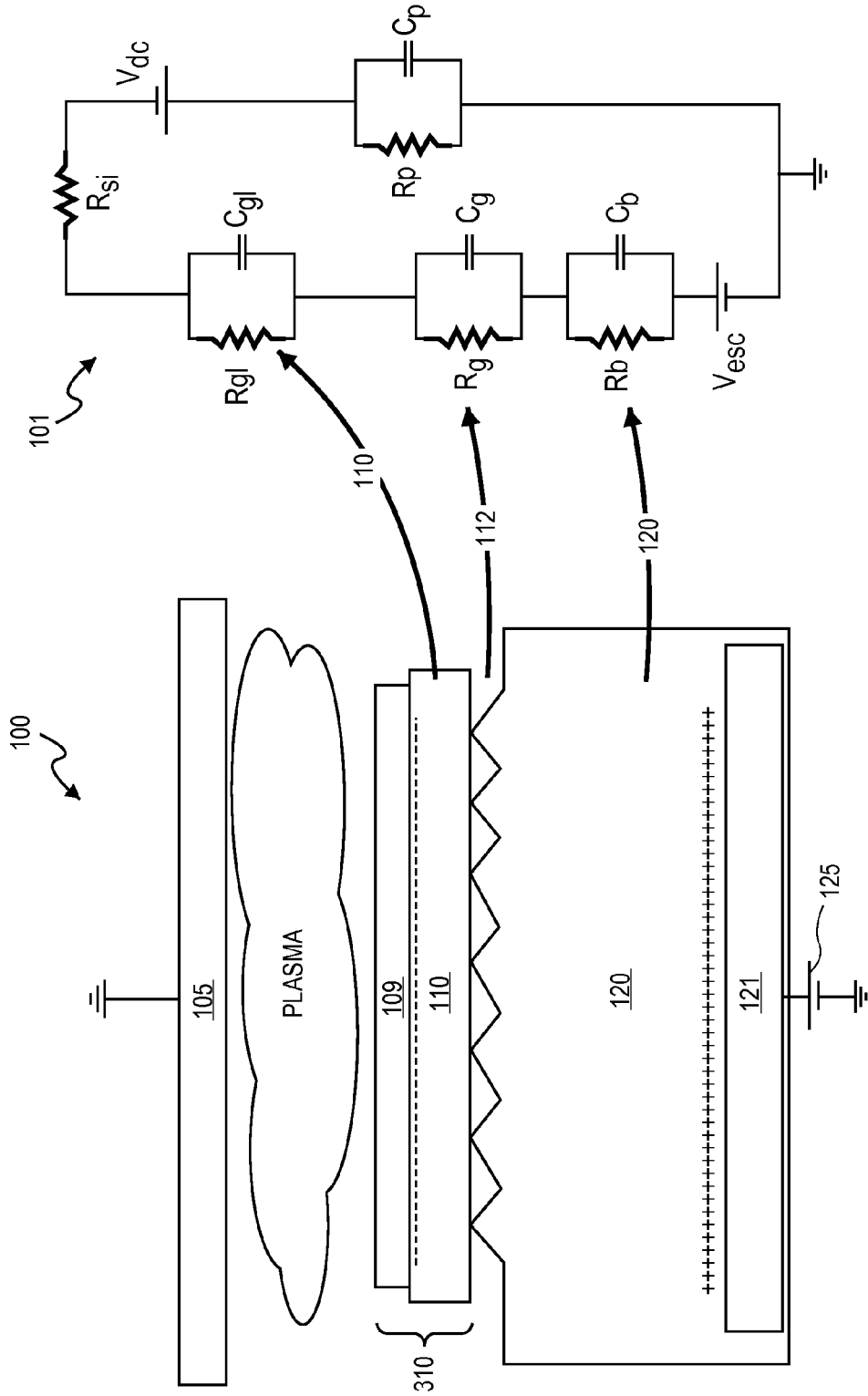

TEMPERATURE ENHANCED ELECTROSTATIC CHUCKING IN PLASMA PROCESSING APPARATUS

CROSS-REFERENCE TO RELATED APPLICATIONS

This application is related to, and claims priority to, U.S. Provisional Application No. 61/377,852 filed on Aug. 27, 2010, entitled "TEMPERATURE ENHANCED ELECTROSTATIC CHUCKING IN PLASMA PROCESSING APPARATUS," the entire contents of which are hereby incorporated by reference herein.

BACKGROUND

1) Field

Embodiments of the present invention generally relate to plasma processing equipment, and more particularly to methods of electrostatically clamping and declamping of a resistive substrate to a chuck disposed within a plasma processing chamber.

2) Description of Related Art

In a plasma processing chamber, such as a plasma etch chamber, the temperature of the substrate is often an important parameter to control during a process. A temperature of a substrate may be controlled by adjusting the temperature of a substrate holder, commonly called a chuck or pedestal. A heat sink and/or heat source is coupled to the chuck to control the chuck at a desired temperature. An electrostatic clamping force may be established between the substrate and the chuck to provide good thermal conduction between the substrate and the chuck (required for the substrate temperature control). One type of electrostatic chuck (ESC) utilizes the Johnson-Raybeck (JR) effect to clamp the substrate to the chuck.

Three dimensional IC (3DIC) manufacture is being adopted as a means to further increase IC integration and generally involves the stacking of multiple semiconductor substrates together, each substrate having a device layer thereon. For improved device cooling and simpler through silicon via (TSV) processing, a semiconductor substrate that is to be stacked upon another is thinned to 50 µm or less. At such thicknesses, the semiconductor substrate is no longer mechanically rigid enough to be safely handled by plasma processing equipment. The thinned semiconductor substrate is therefore affixed to a handle or carrier substrate prior to plasma processing. Currently, the preferred carrier substrate material is borosilicate glass, such as Corning 7740, offering the advantages of a coefficient of thermal expansion (CTE) that is well matched with that of silicon and relatively broad UV transparency window which facilitates affixing the thinned semiconductor substrate to the carrier substrate with UV-sensitive adhesives to form a multi-layered workpiece typically referred to as a silicon-on-glass (SiOG) substrate.

While ESCs have been in service for n-type or p-type silicon substrates conventional in integrated circuit (IC) processing, its functioning with substrates like SiOG which have an effective resistivity much higher than that of silicon, might be problematic causing chucking (resist reticulation, etc.) and dechucking (substrate sticking, etc.) failures.

SUMMARY

Methods and systems for chucking and dechucking resistive substrates in a plasma processing apparatus are described herein. In certain embodiments, methods and systems incorporate modulating a substrate temperature during a plasma process to chuck and dechuck the substrate at first temperatures elevated relative to second temperatures utilized during plasma processing.

In embodiments the difference between an ESC process temperature and at least one of the chucking and dechucking temperatures is at least 35° C. In embodiments, heating the workpiece to the chucking and the dechucking temperatures includes at least one of plasma heating, radiative heating, or conductive heating from the ESC.

In a plasma etch embodiment, a workpiece on an electrostatic chuck (ESC) is heated to a chucking temperature, clamped to the ESC, and cooled from the chucking temperature to a process temperature. A feature is etched into the workpiece while at the process temperature and the workpiece is then heated from the process temperature up to a dechucking temperature where the workpiece is unclamped from the ESC.

In a first plasma etch embodiment, a first and second heat exchanger are coupled to an ESC via a switch valve. The first heat exchanger, operating at a chucking temperature is switched to the ESC to heat the substrate to the first temperature for chucking. The second heat exchanger, operating at a process temperature is switched to the ESC subsequent to substrate being clamped to cool the substrate from the first temperature to the second temperature. The substrate is etched and the first heat exchanger then switched back to the ESC to heat the substrate back to the first temperature for dechucking.

In a second plasma etch embodiment, a single heat exchanger operating at a process temperature is coupled to the ESC and an electrical heater embedded in the ESC is used to bring the substrate to the first temperature for chucking. The heaters are then set idle to cool the substrate down from the first temperature to the second temperature (determined by a heat exchanger set point). The substrate is then etched and the heaters turn on to heat the substrate back to the first temperature for dechucking.

In another plasma etch embodiment, a single heat exchanger operating at a chucking temperature and a chiller operating at a lower temperature is coupled to the ESC via a valves controlled with a PWM controller to heat the substrate to the first temperature for chucking using a first valve duty cycle. The PWM controller then changes the valve duty cycle to cool the substrate from the first temperature to the second temperature. The substrate is then etched and the valve duty cycle is returned to the first duty cycle to heat the substrate back to the first temperature for dechucking.

BRIEF DESCRIPTION OF THE DRAWINGS

Embodiments of the invention are particularly pointed out and distinctly claimed in the concluding portion of the specification. Embodiments of the invention, however, both as to organization and method of operation, together with objects, features, and advantages thereof, may best be understood by reference to the following detailed description when read with the accompanying drawings in which:

FIG. 1A is a block diagram illustrating a multilayered workpiece in a plasma processing chamber, in accordance with an embodiment of the present invention;

FIG. 1B is a diagram illustrating relevant components in an equivalent electrical circuit representative of the configuration depicted in FIG. 1A, in accordance with an embodiment of the present invention;

DETAILED DESCRIPTION

Figure 1C:
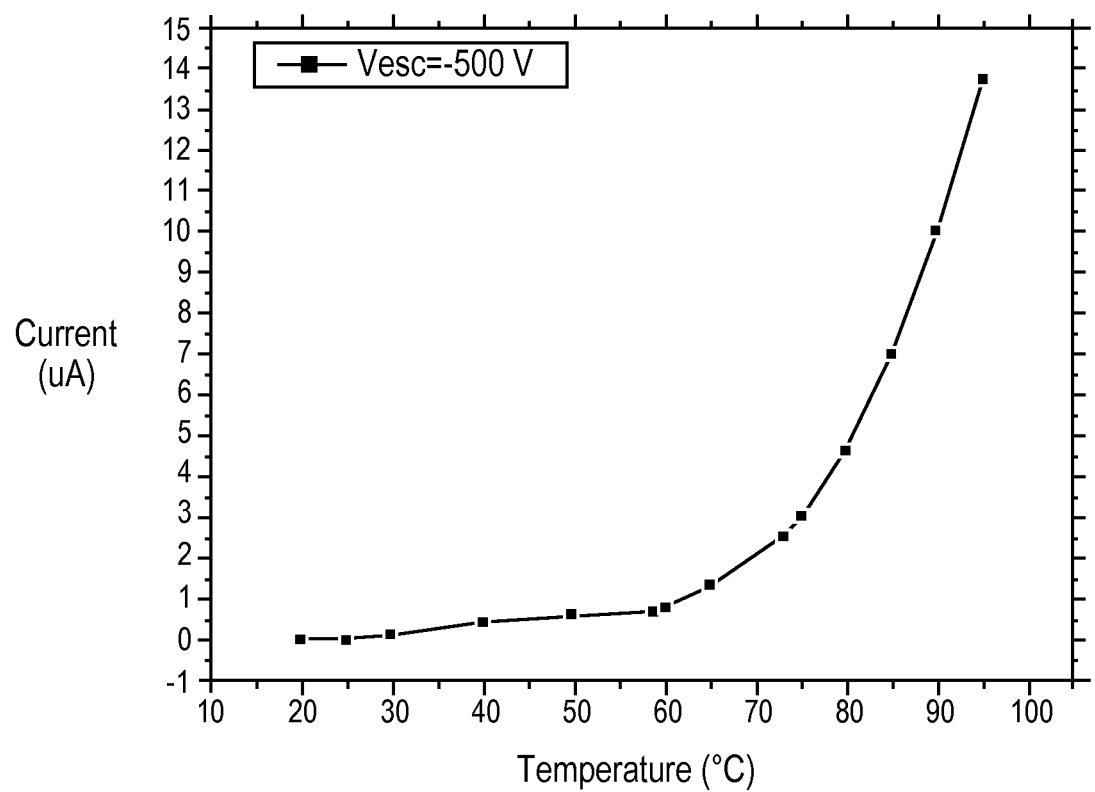
FIG. 1C is a graph illustrating a ESC current as a function of SiOG substrate temperature, in accordance with an embodiment of the present invention.

In the following detailed description, numerous specific details are set forth in order to provide a thorough understanding of embodiments of the invention. However, it will be understood by those skilled in the art that other embodiments may be practiced without these specific details. In other instances, well-known methods, procedures, components and circuits have not been described in detail so as not to obscure the present invention. Some portions of the detailed description that follows are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

An algorithm or method is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, levels, numbers or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. An apparatus may be specially constructed for the desired purposes, or it may comprise a general purpose computing device selectively activated or reconfigured by a program stored in the device. Such a program may be stored on a non-transitory storage medium, such as, but not limited to, any type of disk including floppy disks, optical disks, compact disc read only memories (CD-ROMs), magnetic-optical disks, read-only memories (ROMs), random access memories (RAMs), electrically programmable read-only memories (EPROMs), electrically erasable and programmable read only memories (EEPROMs), magnetic or optical cards, or any other type of media suitable for storing electronic instructions in a non-transitory manner, and capable of being coupled to a system bus for a computing device.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

FIG. 1A is a block diagram illustrating a multilayered workpiece 310 in a plasma processing chamber 100, in accordance with an embodiment of the present invention. FIG. 1B is a diagram illustrating relevant components in an electrical circuit 101 representative of the configuration depicted in FIG. 1A, in accordance with an embodiment of the present invention. As illustrated, while disposed in the plasma processing chamber 100, the workpiece 310 is held in place on a surface of a bottom electrode by an ESC 120. The ESC 120 provides good thermal contact between the workpiece 310 the bottom electrode and seals a backside of the workpiece for helium backside cooling. Opposite the RF electrode 105 is a DC electrode 121 embedded in the ESC 120 (or disposed below) is biased relative to the potential of the workpiece 310. The chucking force per unit of workpiece area is a function of the energy density stored in capacitance between the bottom of the workpiece 310 and the surface of the ESC 120 (in the gap 112). For JR chucks, the ESC 120 comprises a leaky dielectric having high enough conductivity that DC bias charge moves toward the top surface of the ESC 120 so that a majority of voltage potential drop occurs across the gap 112 between the workpiece 310 and the top surface of the ESC 120.

In the embodiment depicted in FIG. 1A, the workpiece 310 includes a semiconductor substrate 109 affixed to a carrier substrate 110. While the semiconductor substrate 109 is any conventional semiconductor employed in the art, such as a group IV or (e.g., silicon, silicon germanium) or group III-V (e.g., gallium nitride, gallium arsenide, etc.), the carrier substrate 110 is a material having an electrical resistivity that is high enough to cause a significant fraction of ESC voltage drop across the thickness of the carrier substrate 110 when an ESC at or below room temperature.

The electrical circuit 101 (FIG. 1B) provides a lumped element model in which the carrier substrate 110 is represented by a resistor, $R_{gl}$, in parallel with a capacitance, $C_{gl}$. This carrier substrate element is in series with the semiconductor substrate 109 which has a room temperature conductivity high enough be represented as a purely resistive element, $R_{si}$. The carrier substrate element is further in series with the gap resistance and capacitance, $R_g$ and $C_g$, and the bulk resistance and capacitance, $R_b$ and $C_b$, of the ESC 120. Completing the circuit 101 is the plasma resistance and capacitance elements $R_p$ and $C_p$. Because of the high resistivity of the carrier substrate 110 at room temperature, the capacitance, $C_{gl}$, causes a significant fraction of the DC voltage applied to the ESC to drop across the carrier substrate 110 for a significantly weaker electric field across the gap 112. Exemplary carrier substrates are made of borosilicate glass, such as Corning 7740, or other materials having a resistivity of at least $10^8$ Ohm-cm at room temperature.

FIG. 1C is a graph illustrating an ESC current as a function of a top surface temperature of a SiOG workpiece (e.g., as measured with a thermocouple affixed to the topside of the silicon substrate), in accordance with an embodiment of the present invention. As shown, ESC current for an applied DC voltage potential of −500V increases by approximately two orders of magnitude between 20 and 90° C. It has been found by measuring the conductivity of two different types of commercially available glass carrier substrates that the resistivity dependence on temperature is well matched to an Arrhenius function (~exp(−Ea/T)) where Ea is the activation energy of Na ions in the glass (0.8-0.88 eV). As such, in embodiments of the present invention, the change in total resistance of the circuit 101 varies as a log-linear function of 1/T from 35 Megaohm at 90° C. to at least 5 Gigaohm at 20° C.

Figure 2:
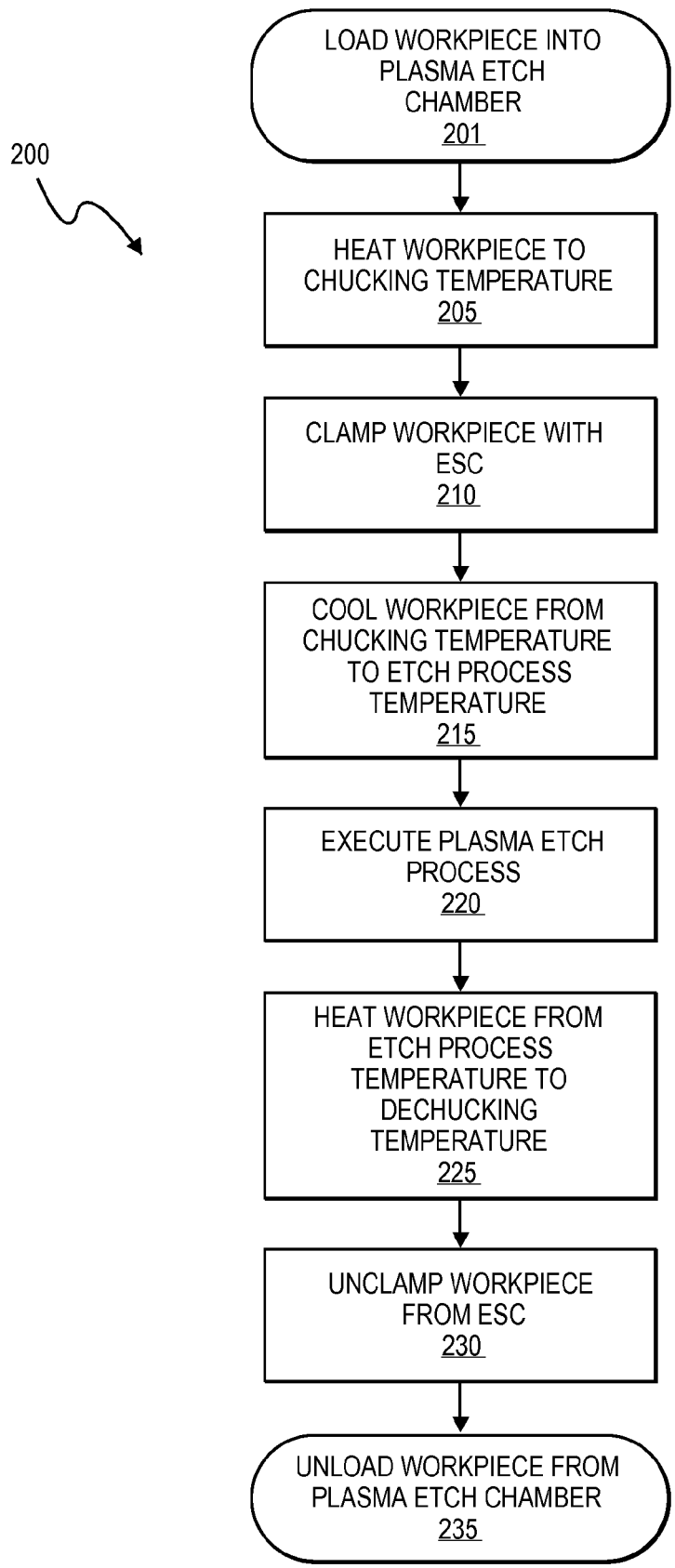
FIG. 2 is a flow diagram illustrating particular operations in a method for chucking, etching, and dechucking a workpiece including a highly resistive substrate, in accordance with an embodiment of the present invention.

FIG. 2 is a flow diagram illustrating particular operations in a method 200 for chucking, etching, and dechucking a workpiece including a highly resistive substrate, in accordance with an embodiment of the present invention.

Figure 3A:
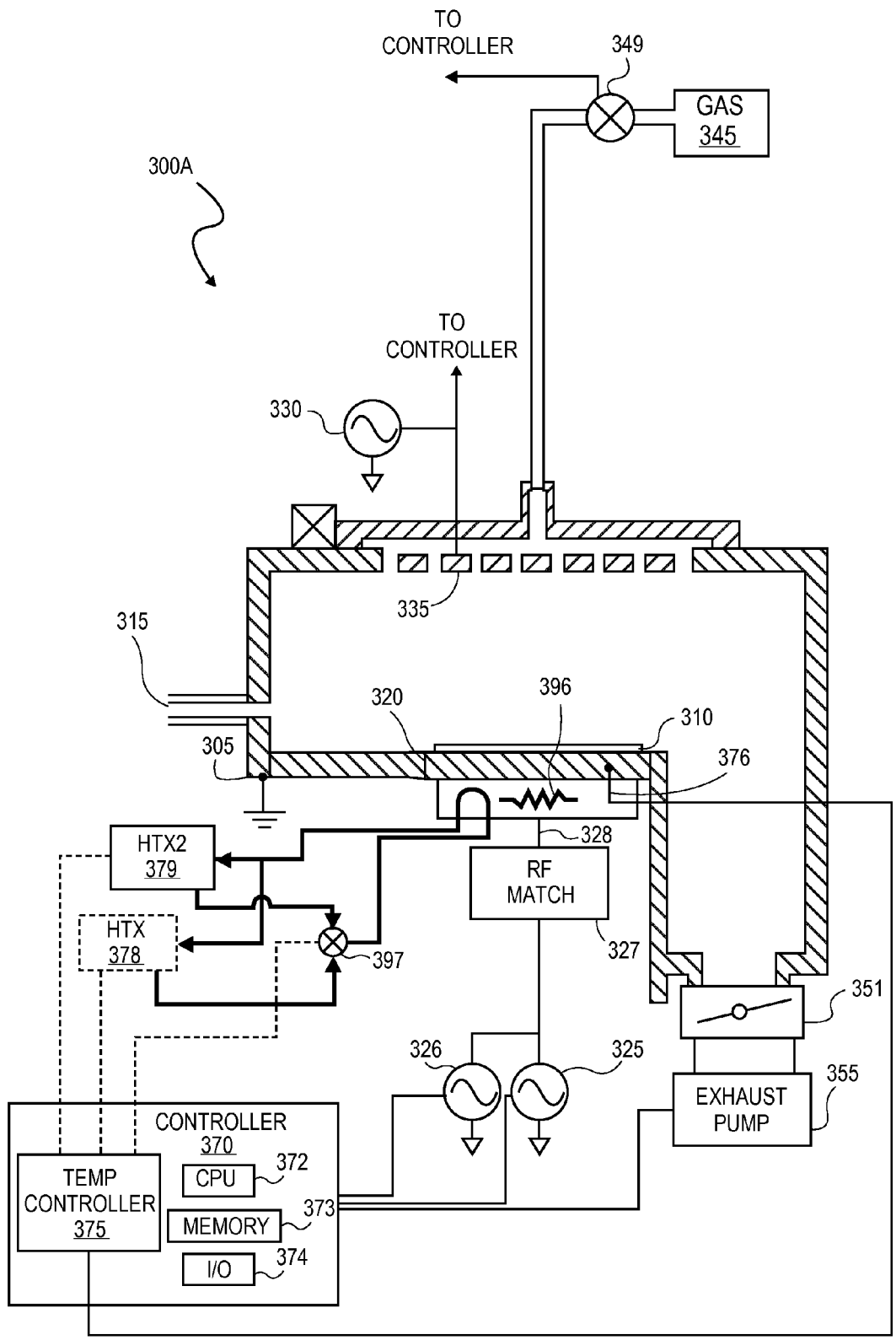
FIGS. 3A and 3B illustrate schematics of plasma etch systems including hardware to execute the method illustrated in FIG. 2, in accordance with an embodiment of the present invention.
Figure 3B:
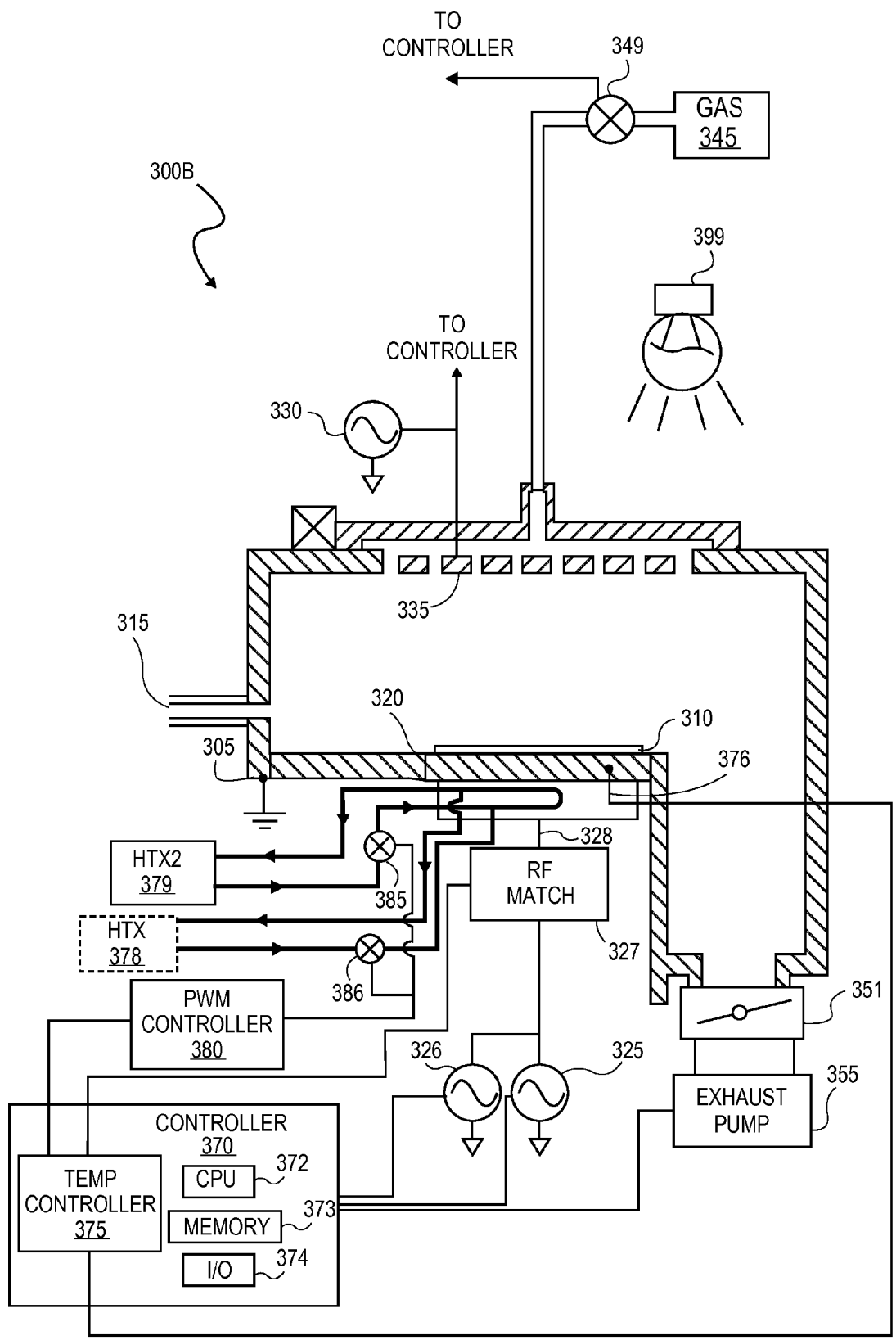

Referring to FIG. 2, at operation 201 the workpiece 310 is provided in a plasma processing system, such as the plasma etch chambers 300A and 300B (FIGS. 3A, 3B). FIGS. 3A and 3B illustrate a cross-sectional schematic view of plasma etch systems 300A and 300B including hardware to execute the method illustrated in FIG. 2, in accordance with an embodiment of the present invention. While the exemplary embodiments are described in the context of the plasma etch systems 300A and 300B, it should be further noted that the chucking and dechucking algorithms described herein are also adaptable to other plasma processing systems in which the processing temperature is similarly low enough for the substrate 110 to be too resistive to readily develop an electrostatic clamping force.

The plasma etch systems 300A and 300B may be any type of high performance etch chamber known in the art, such as, but not limited to, Enabler™, MxP®, MxP+™, Super-E™, DPS II AdvantEdge™ G3, Producer Etch™, or E-MAX® chambers manufactured by Applied Materials of CA, USA. Other commercially available etch chambers may be similarly controlled. The plasma etch systems 300A,B includes a grounded chamber 305. The workpiece 310 is loaded through an opening 315 and clamped to a temperature controlled electrostatic chuck 320. Process gases, are supplied from gas source 345 through a mass flow controller 349 to the interior of the chamber 305. Chamber 305 is evacuated via an exhaust valve 351 connected to a high capacity vacuum pump stack 355.

At operation 215, the workpiece 310 is heated to a chucking temperature. Elevating the temperature of the workpiece 310 to the chucking temperature is to accelerate the rate at which the electrostatic clamping force is developed above the rate possible at the etch process temperature. As used herein, "process temperature" refers to the temperature of an ESC during a plasma process, such as a plasma etch process and it should be understood that various portions of the workpiece 310 may have temperatures different than that of the ESC because of heat transfer limitations of the workpiece 310. The chucking temperature may be any temperature higher than the process temperature of the etch process that is to be subsequently performed on the workpiece 310. For one plasma etch embodiment in which the workpiece 310 includes a patterned photo resist mask disposed over the semiconductor substrate 109, the chucking temperature is below 110° C. to avoid reticulation of the photo resist mask. For embodiments employing a borosilicate glass carrier substrate 110, the chucking temperature is over 50° C., favorably between 60° C. and 90° C., and ideally between 70° C. and 90° C. The workpiece 310 may be heated in any manner, such as, but not limited to, plasma heating, radiative (lamp) heating, or conductive heating from the ESC. While a plasma heating embodiment is further described in FIGS. 4A-4C, embodiments employing non-plasma heat sources offer the advantages of better (and independent) control over wafer temperature, minimal interference with the etch process performance, and avoidance of plasma damage.

Referring to FIG. 3A, the plasma etch system 300A includes a fluid heat transfer system coupled to the ESC 320 to provide a very wide operating temperature window which encompasses both the process temperature setpoint and also the chucking temperature so that the ESC 320 may controllably operate at both the process and chucking temperatures. In the exemplary system 300A, the chuck heating power (e.g., to elevate the workpiece 310 to 60° C. or more for chucking purposes) is provided by a heat transfer fluid loop coupled, either directly, or indirectly, to a first heat exchanger (HTX) 378 and a second heat exchanger (HTX2) 379. The HTX 378 has a liquid at temperature high enough to reach a chucking temperature (e.g., Galden or Fluorinert, etc. at a temperature setpoint of 85° C.) while HTX2 379 has a liquid at a temperature to cool the ESC 320 from the chucking temperature to the process temperature (e.g., Galden or Fluorinert, etc. at a temperature setpoint of −5° C.). The temperature controller 375 controls switching from the first heat exchanger HTX 378 to the second heat exchanger HTX2 379 (e.g., via valve(s) 397) to alternate between ESC heating and cooling modes during the chucking/dechucking and processing of a workpiece, respectively. For such embodiments, a total fluid flow to the chuck 320 at any given time is delivered from either the first or second heat exchanger which allows the system 300A to reach both the high ESC operating temperatures useful for workpiece chucking and low ESC operating temperatures useful for plasma processing.

In another embodiment, also depicted in FIG. 3A, the plasma etch system 300A includes a resistively heated ESC 320. For such embodiments, a resistive heat source 396 controlled by the controller 375 is embedded in the ESC 320 or otherwise placed in thermal contact with the ESC 320. The resistive heat source 396 is operable to heat the ESC 320 up to a chucking/dechucking temperature. In particular embodiments of the plasma etch system 300A, a single heat exchanger HTX2 379 is employed in combination with the resistive heat source 396.

In another embodiment, further illustrated in FIG. 3B, the ESC 320 is coupled to the first and second heat exchangers HTX 378, HTX2 379 via one or more digital valves 385, 386 which are controlled between open and closed states by a PWM controller 380. For such an embodiment, the HTX 378 is again operated with a liquid temperature high enough to reach a chucking temperature (e.g., Galden or Fluorinert, etc. at a temperature setpoint of 85° C.) while the HTX2 379 is operated at a liquid temperature low enough to cool the ESC 320 from the chucking temperature to the process temperature (e.g., Galden or Fluorinert, etc. at a temperature setpoint of −5° C. In this embodiment, the pulse width modulation (PWM) controller 380 operates the digital valves 385 and 386 such that only one is open at any given time and heating and cooling of the chuck 320 is referred to herein as "pulsed." A pulse of cooling power is provided when valve 385 is controlled to the open state for a period of time defined by a PWM duty cycle. Similarly, a pulse of heating power is provided to the chuck 320 when valve 386 is controlled to be in the open state for a period of time defined by the PWM duty cycle. To reach a chucking temperature at operation 205, a heat transfer fluid at a first temperature may be provided to the ESC 320 with a first duty cycle (e.g., valve 386 open 90% of a duty cycle).

In another embodiment, also depicted in FIG. 3B, the plasma etch system 300B includes one or more lamps 399 to heat the workpiece 310 to chucking and dechucking temperatures above the etch process temperature. Similar to embodiments with a resistively heated ESC, embodiments including the lamps 399 may include only a single heat exchanger HTX2 379 operated at the process temperature.

Returning to FIG. 2, at operation 210, the workpiece 310 is clamped to the ESC 120 while at the chucking temperature. In an embodiment, electrostatic clamping is achieved with a DC voltage potential of 1000V or less in magnitude while in preferred embodiments, a voltage potential is less than 700V. For certain embodiments where the chucking temperature is between 60° C. and 90° C., clamping of a borosilicate glass carrier substrate 110 is achieved by applying a voltage potential of 700V or less. Upon clamping at operation 210, for those embodiments where the heat source employed in operation 205 is other than the ESC, the temperature of the workpiece 310 will become controlled to the temperature of the ESC because of the improved thermal contact clamping provides. After applying a clamping voltage for a predetermined duration (e.g., 10-60 seconds), or after a decline in the temperature of the workpiece 310 (where the ESC becomes a heat sink to another heating power source), backside helium flow may be initiated in any manner conventional in the art to further improve thermal coupling between the workpiece 310 and the ESC 120.

With the workpiece 310 clamped, at operation 215 the workpiece 310 is cooled from the chucking temperature down to a predetermined plasma process temperature. In exemplary plasma etch embodiments, the process temperature is 50° C. or less with high power processes potentially requiring a much lower, (e.g. 15° C. or less) setpoint. In particular embodiments the difference between the plasma process temperature and the chucking temperature is at least 35° C. For embodiments where ESC temperature modulation is relied upon to modulate the workpiece temperature between the chucking, process, and dechucking temperatures, a heat transfer fluid at a second temperature, cooler than for the chucking sequence, is provided to the ESC. For example, in the embodiment illustrated in FIG. 3A, valve(s) 397 switch the ESC 320 from HTX 378 to HTX2 379. Alternatively, for the embodiment illustrated in FIG. 3B which utilizes a PWM controller 380, to cool the ESC 320 from chucking temperature to the plasma etch process temperature, a heat transfer fluid at a second temperature is provided to the ESC 320 by changing the duty cycle from that utilized during the heating operation 205 (e.g., valve 385 open 90% of a duty cycle). Lamp 399 and/or resistive heater 396 may similarly be turned off at operation 215.

While at the plasma processing temperature, plasma processing is performed at operation 220. For example, in the exemplary etch system, a dielectric etch process is performed at operation 220 to form through vias or other etched features into the thinned semiconductor substrate 110. Because dielectric etches often utilize high powers (e.g., 1000 W or more) resulting in a high thermal load to the wafer, good workpiece clamping is a prerequisite to avoid mask reticulation.

In an embodiment, after executing the plasma etch process operation 220, the workpiece 310 is heated up from the plasma processing temperature to a dechucking temperature. At the lower plasma process temperatures described for the exemplary plasma etch embodiments, charge migration through the carrier substrate 110 is very low but potentially nonzero such that chucking force may continue to drift over the duration of the etch process. Also, declamping rates, just as clamping rates, are increased as a resistive substrate, such as glass, is heated. Therefore, the workpiece 310 is favorably heated back up above the plasma process temperature upon completion of the plasma etch process and prior to attempting to lift or otherwise remove the workpiece from the processing chamber. In preparation for dechucking the substrate, heating at operation 225 may be performed by any of the methods described elsewhere herein for the substrate heating performed at operation 205. For one embodiment illustrated in FIG. 3A which utilizes dual heat exchangers, to heat the ESC 320 from etch process temperature to the dechucking temperature, a switch is made from the second heat exchanger HTX2 379 back to the first heat exchanger HTX 378. Alternatively, for one embodiment illustrated in FIG. 3B including a PWM controller 380, a heat transfer fluid at a third temperature is provided to the ESC 320 by changing the duty cycle from that utilized during the etch process operation 220. In still other embodiments, resistive heating of the ESC 320 or lamp heating of the substrate may be employed to increase the workpiece temperature for dechucking.

In certain embodiments where the workpiece is heated by other than the ESC 120, backside helium flow may be discontinued at operation 220 to further reduce thermal coupling between the workpiece 310 and the ESC 320.

The dechucking temperature may be any temperature higher than the process temperature of the etch process to provide an improvement in the conductivity of the substrate sufficient for a reasonably brief dechucking sequence. In an embodiment, the dechucking temperature is comparable, and favorably equal, to the chucking temperature. For example, in the exemplary embodiment where the workpiece 310 includes a resistive substrate 110 of borosilicate glass, the dechucking temperature is over 50° C., favorably between 60° C. and 90° C., and ideally between 70° C. and 90° C. For the exemplary plasma etch embodiments where the process temperature is below 20° C., the dechucking temperature, like the chucking temperature, is at least 35° C. greater than the process temperature.

At operation 230, the workpiece 310 is unclamped from the ESC 120 while at the dechucking temperature. In an embodiment, electrostatic declamping is achieved with a DC voltage potential reversed from that used for clamping or alternatively, the DC potential used for clamping is merely removed. In embodiments, the DC voltage potential applied for unclamping is 200V or less in magnitude while in preferred embodiments, the voltage potential is less than 100V. For certain embodiments where the dechucking temperature is between 60° C. and 90° C., declamping of a borosilicate glass carrier substrate 110 is achieved by applying a voltage potential of 100V or less for a duration of 10-60 seconds. Upon declamping at operation 230, for those embodiments where the heat source employed in operation 230 is other than the ESC, the temperature of the workpiece 310 will deviate from the temperature of the ESC because of the reduced thermal contact in the declamped state. For embodiments where the ESC 120 is heating the workpiece 310 to the dechucking temperature, the backside helium flow is maintained throughout operation 225, a backside helium leak rate increase or backside pressure drop may serve to indicate the workpiece 310 has been unclamped. Upon declamping the workpiece 310, it may be unloaded or removed from the plasma processing chamber at operation 235.

Figure 4A:
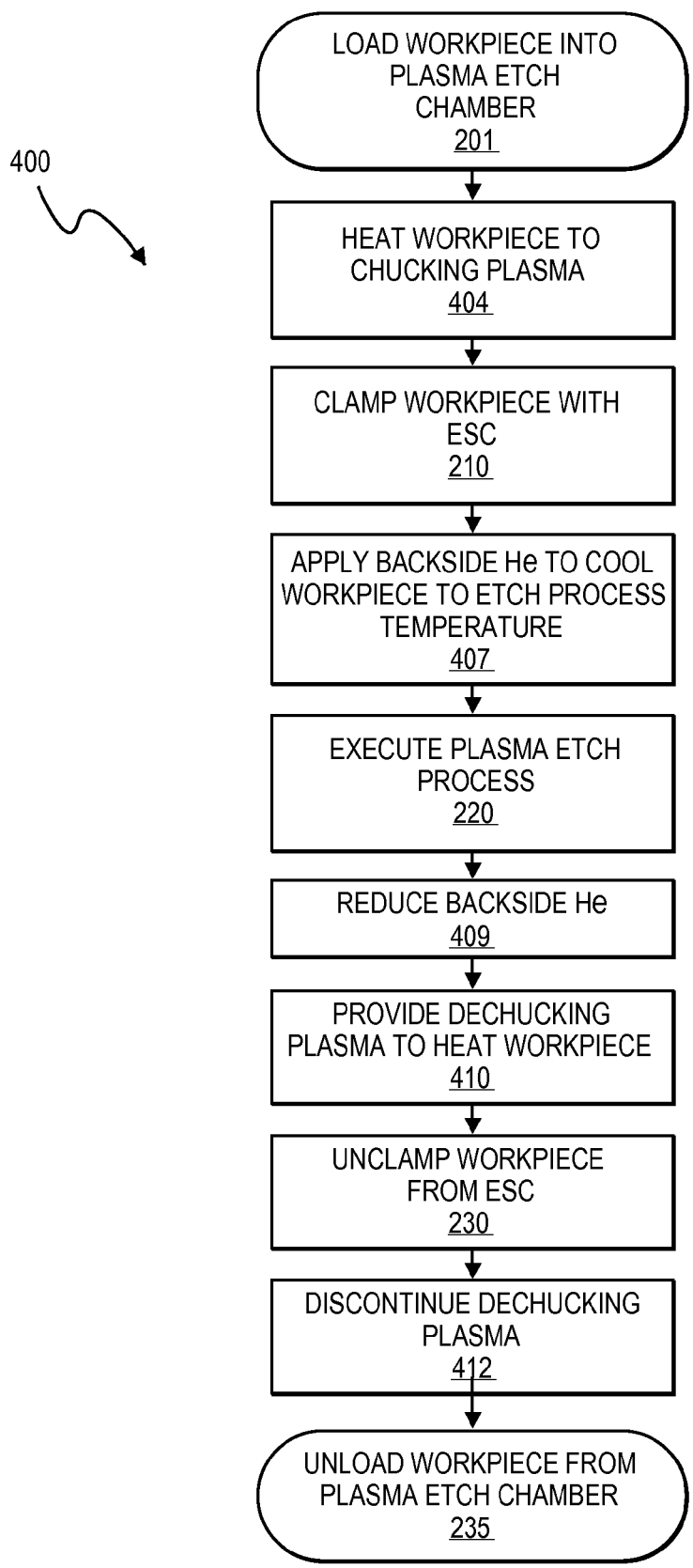
FIG. 4A is a flow diagram illustrating particular operations in a method for plasma heated chucking and dechucking of a workpiece including a highly resistive substrate, in accordance with an embodiment of the present invention.

FIG. 4A is a flow diagram illustrating particular operations in a method 400 for plasma heated chucking and dechucking of a workpiece including a highly resistive substrate, in accordance with an embodiment of the present invention. At operation 201 the workpiece 310 including a resistive carrier substrate 110 is provided in a plasma processing system, such as the plasma etch chambers 300A and 300B (FIGS. 3A, 3B). At operation 404, the workpiece 310 is heated to a chucking temperature with a plasma as the primary heat source. The chucking temperature may be any temperature higher than a maximum process temperature of the etch process that is to be subsequently performed on the workpiece 310.

Referring to FIGS. 3A, 3B, when plasma power is applied to the chamber 305, a plasma is formed in a processing region over workpiece 310. A first plasma bias power 325 is coupled to the chuck 320 (e.g., cathode) to energize the plasma. The addition of bias power aids in the heating of the carrier substrate 110 by way of ion bombardment of the top surface of the workpiece 310. The plasma bias power 325 typically has a low frequency between about 2 MHz to 60 MHz, and in a particular embodiment, is in the 13.56 MHz band. A second plasma bias power 326 may also be provided, for example operating at about the 2 MHz band which is connected to the same RF match 327 as plasma bias power 325 to provide a dual frequency bias power. In embodiments, a total bias power ($W_{b,tot}$) is between 200 W and 2000 W and favorably greater than 400 W but below 1000 W for a power density which is capable of significant plasma heating with limited plasma induced damage.

A plasma source power 330 is coupled through a match (not depicted) to a plasma generating element 335 (e.g., showerhead) which may be anodic relative to the chuck 320 to provide high frequency source power to energize the plasma. The plasma source power 330 typically has a higher frequency than the plasma bias power 325, and in a particular embodiment, is in the 60 MHz band. In particular embodiments the top source operates above 1000 W and favorably between 1000 W and 2000 W when bias power is between 400 W and 1500 W. Generally, the chucking plasma may be of any gaseous species, but the particular chemistry should be chosen so that the etching of the workpiece 310 is minimized during chucking/dechucking steps. In the exemplary embodiment, a gas including at least argon (Ar) is energized by the applied RF power to form an Ar chucking plasma. Alternatively, or in combination, nitrogen ($N_2$), helium (He) or other inert species may be employed.

Figure 4B:
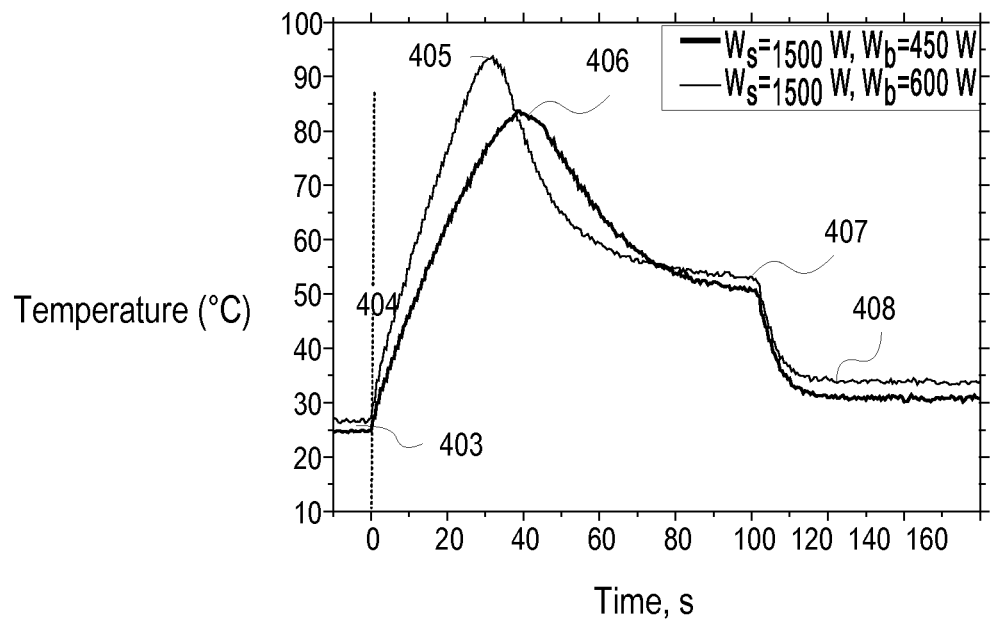
FIGS. 4B and 4C are graphs illustrating a measured workpiece temperature as the chucking and dechucking portions of the method depicted in FIG. 4A are performed, in accordance with an embodiment of the present invention.

At operation 210, the workpiece 310 is electrostatically clamped as previously described for non-plasma heated embodiments. After applying a clamping voltage for a fixed time or until a monitored temperature of the workpiece 310 becomes dominated by the ESC 320 which may remain at the process temperature throughout the plasma heating operation 404, backside helium is applied to further couple the substrate temperature to that of the ESC 320. FIG. 4B is a graph illustrating a measured workpiece temperature as the chucking portion of the method 400 is performed, in accordance with an embodiment of the present invention. As shown, at 403, the temperature of the workpiece 310 is approximately 25° C. At time 0, chucking plasma 400 is initiated and the temperature of the workpiece 310 increases over time, dependent on the plasma power conditions. For a 1500 W source, 600 W bias power embodiment, a maximum temperature 405 is reached at 33 seconds while a maximum temperature 406 is reached at 39 seconds for a 1500 W source, 450 W bias power embodiment. The chucking temperature at operation 404 is to be in the ranges previously described for operation 205 depicted in FIG. 2. Notably, both plasma heating embodiments reach a maximum temperature below a resist reticulation point and because the heated substrate reaches a point where the clamping voltage applied at operation 210 results in clamping, the substrate temperature is self-limited limited to a maximum temperature 405 or 406 which is a function of the rate at which power is coupled from the plasma into the workpiece 310. As such, a rigorous model of the heat transfer function between the plasma and workpiece 310 is not necessary.

The chucking plasma may be discontinued based on a fixed predetermined time, on identification of the maximum temperature 405, 406, or on other signal processing logic capable of detecting that ESC control effort on the workpiece temperature has become significantly greater than at time 0. Returning to FIG. 4A, at operation 407, backside helium pressure is applied in any manner known in the art to improve thermal coupling between the workpiece 310 and ESC 320. Backside helium pressure may be applied either before or after the chucking plasma is discontinued. As shown in FIG. 4B, upon application of backside helium at time 100 sec, there is a drop 407 in the workpiece temperature until a steady state 408 is achieved.

Returning to FIG. 4A, at operation 220 the plasma etch process 200 is executed while the workpiece 310 is at the process temperature. At operation 220, any of the etch processes previously described for operation 220 of FIG. 2 may be performed with the process temperature being within the ranges previously described. Following completion of the etch process at operation 220, the backside helium pressure is reduced at operation 409 to reduce thermal coupling between the ESC 320 and workpiece 310. In one embodiment, the backside helium pressure is reduced to 0 while in other embodiments the pressure is reduced to 5 Torr.

With the backside helium reduced, a dechucking plasma is provided at operation 410 to heat the substrate 110 through plasma heating of the top surface of the workpiece 310. The dechucking temperature at operation 410 is to be in the ranges previously described for operation 225 of FIG. 2. The dechucking plasma conditions may be any of those described for the chucking plasma at operation 404 to elevate the substrate temperature above the process temperature. Alternatively, where an in-situ resist strip process and/or and in-situ chamber clean is to be performed as a post-etch-plasma (PEP) subsequent to the etch process at operation 220, the PEP further serves as the dechucking plasma at operation 410. The PEP may utilize any gases conventional for this purpose, such as, but not limited to $O_2$, $H_2O$ vapor, and $H_2{:}N_2$, any of which may be diluted with inerts and/or combined with fluorocarbon or halogens sources, etc. For such embodiments, upon the chemistry changing from the eth process to the PEP, backside helium pressure is reduced at operation 409 and the PEP begins to heat the workpiece 310 at operation 410. Thus, while plasma heating toward the dechucking temperature, the PEP may continue to etch features on the workpiece 310, such as photoresist and/or amorphous carbon mask features.

At operation 230, the workpiece 310 is unclamped from the ESC 320. To unclamp the workpiece 310 from the ESC 320, the DC voltage applied to the ESC 320 is reversed or removed while the workpiece 310 is at the dechucking temperature. In embodiments, the change in the applied DC voltage occurs before the dechucking plasma is discontinued and in further embodiments, the change in the applied DC voltage occurs before the dechucking plasma is even initiated. For example, where a PEP is also to serve as the dechucking plasma, a change in the DC voltage applied to the ESC is performed prior to heating the workpiece to the dechucking temperature and may further be changed during plasma etching a feature on the workpiece during the PEP.

With the workpiece 310 unclamped, the dechucking plasma is discontinued at operation 412 and the workpiece 310 is unloaded from the plasma etch chamber at operation 235. A process controller is to discontinue the dechucking plasma either in response to expiration of a fixed time, completion of a PEP (e.g., endpointed process having a minimum time sufficient for the workpiece to become unclamped), in response to a backside helium leak rate increase (for those embodiments where the backside helium is reduced to some pressure greater than 0 Torr), or in response to a workpiece temperature shift (e.g., via a pyrometric measurement, etc.).

Figure 4C:
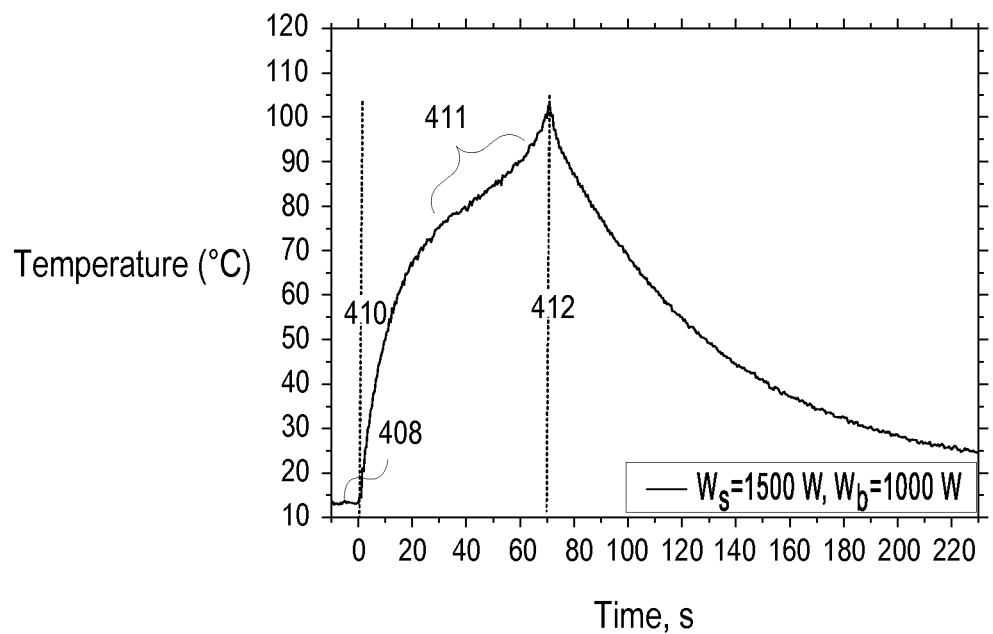

The FIG. 4C is a graph illustrating a measured workpiece temperature as the dechucking portion of the method 400 depicted in FIG. 4A is performed, in accordance with an embodiment of the present invention. As shown, the workpiece 310 begins at the process temperature 408 (e.g., ~13° C.) and at time 0 with backside helium pressure off (0 Torr), the dechucking plasma is initiated at operation 410. The workpiece temperature increases with the expected function until the carrier substrate 110 is dechucked at the dechucking temperature 411, which for the exemplary embodiment is at least 50 degrees higher than the process temperature. At time 70 sec, the dechucking plasma is discontinued at operation 412 and the workpiece temperature returns to ambient conditions.

Referring again to FIGS. 3A and 3B, the temperature controller 375 is to execute many of the chucking and dechucking algorithms described herein and may be either software or hardware or a combination of both. The temperature controller 375 is to output control signals affecting the rate of heat transfer between the chuck 320 and a heat source and/or heat sink external to the plasma chamber 305 (e.g., heat exchanger 378 and/or 379 or lamp 399). For chucking and dechucking embodiments which utilize plasma heating, controller 370 executes the chucking and dechucking algorithms described herein and may be either software or hardware or a combination of both.

Figure 5:
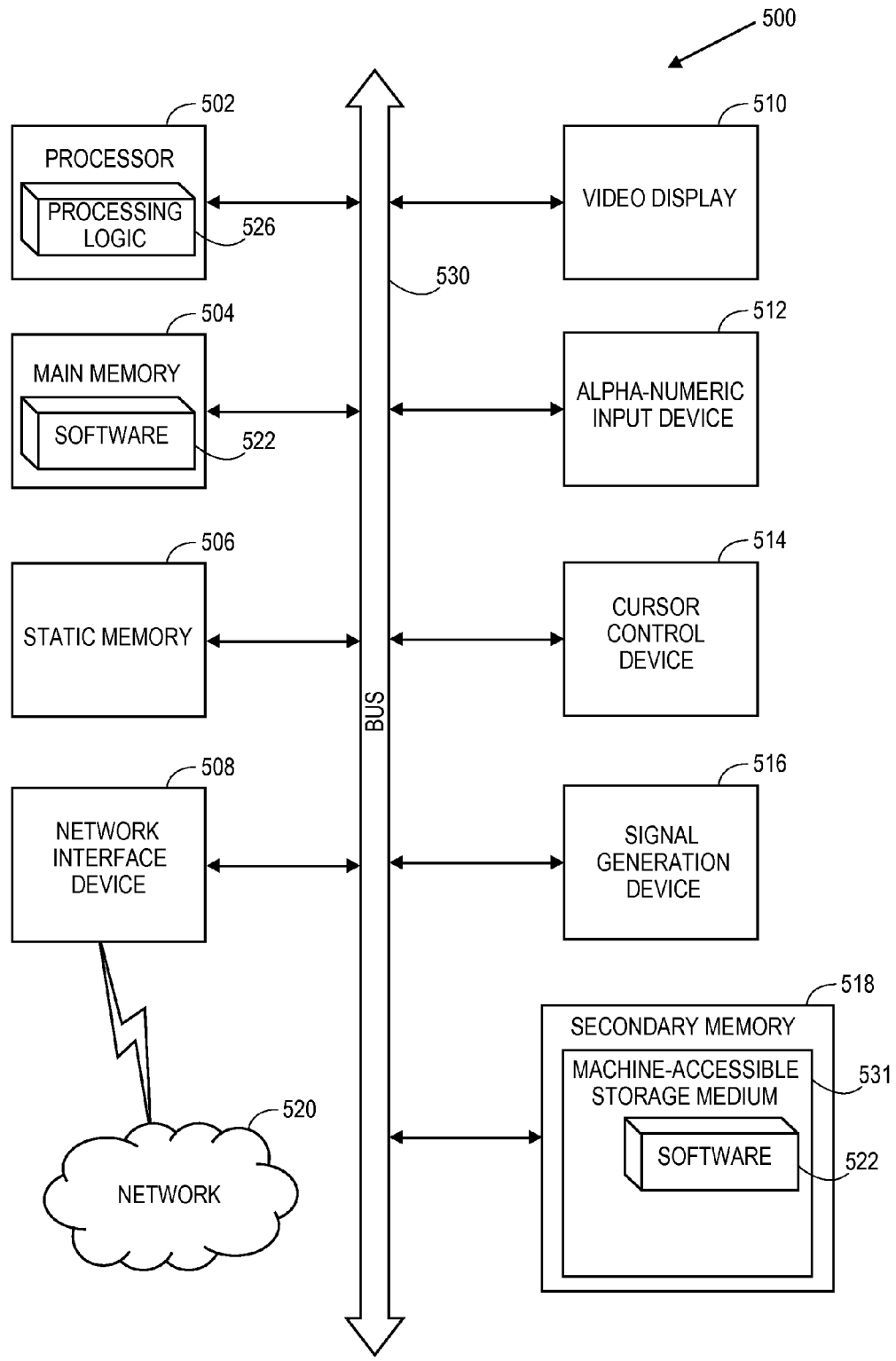
FIG. 5 illustrates a block diagram of an exemplary computer system incorporated into the plasma etch systems depicted in FIGS. 3A and 3B, in accordance with one embodiment of the present invention.

FIG. 5 illustrates a diagrammatic representation of a machine in the exemplary form of a computer system 500 which may be utilized to perform the chucking and dechucking operations described herein. In one embodiment, the computer system 500 may be provisioned as the controller 370 and/or temperature controller 375 in the plasma etch system 300A or 300B. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 500 includes a processor 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a secondary memory 518 (e.g., a data storage device), which communicate with each other via a bus 530.

The processor 502 represents one or more general-purpose processing devices such as a microprocessor, central processing unit, or the like. More particularly, the processor 502 may be a complex instruction set computing (CISC) microprocessor, reduced instruction set computing (RISC) microprocessor, very long instruction word (VLIW) microprocessor, processor implementing other instruction sets, or processors implementing a combination of instruction sets. The processor 502 may also be one or more special-purpose processing devices such as an application specific integrated circuit (ASIC), a field programmable gate array (FPGA), a digital signal processor (DSP), network processor, or the like. The processor 502 is configured to execute the processing logic 526 for performing the temperature control operations discussed elsewhere herein.

The computer system 500 may further include a network interface device 508. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), and a signal generation device 516 (e.g., a speaker).

The secondary memory 518 may include a machine-accessible storage medium (or more specifically a computer-readable storage medium) 531 on which is stored one or more sets of instructions (e.g., software 522) embodying any one or more of the chucking/dechucking temperature control algorithms described herein. The software 522 may also reside, completely or at least partially, within the main memory 504 and/or within the processor 502 during execution thereof by the computer system 500, the main memory 504 and the processor 502 also constituting machine-readable storage media. The software 522 may further be transmitted or received over a network 520 via the network interface device 508.

The machine-accessible storage medium 531 may further be used to store a set of instructions for execution by a processing system and that cause the system to perform any one or more of the chucking and/or dechucking algorithms described herein. Embodiments of the present invention may further be provided as a computer program product, or software, that may include a machine-readable medium having stored thereon instructions, which may be used to program a computer system (or other electronic devices) to control a substrate chucking and dechucking temperatures according to the present invention as described elsewhere herein. A machine-readable medium includes any mechanism for storing \information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, and other non-transitory storage media.

It is to be understood that the above description is intended to be illustrative, and not restrictive. Many other embodiments will be apparent to those of skill in the art upon reading and understanding the above description.

What is claimed is:

1. A method for clamping a workpiece in a plasma etch process, comprising:
providing a workpiece on an electrostatic chuck (ESC) disposed with a plasma etch chamber;
heating the workpiece to a chucking temperature;
clamping the workpiece to the ESC upon reaching the chucking temperature;
cooling the workpiece from the chucking temperature to a process temperature;
plasma etching a feature into the workpiece while at the process temperature;
heating the workpiece from the process temperature up to a dechucking temperature; and
unclamping the workpiece from the ESC upon reaching the dechucking temperature.

2. The method of claim 1, wherein the workpiece comprises a semiconductor substrate affixed to a glass carrier substrate.

3. The method of claim 1, wherein the difference between the process temperature and at least one of the chucking and dechucking temperatures is at least 35° C.

4. The method of claim 3, wherein the process temperature is below 15° C. and both the chucking and dechucking temperatures are above 50° C.

5. The method of claim 1, wherein heating the workpiece to the chucking and the dechucking temperatures further comprises at least one of plasma heating, radiative heating, or conductive heating from the ESC.

6. The method of claim 5, wherein heating the workpiece to the chucking temperature further comprises providing a heat transfer fluid at a first temperature to the ESC, wherein cooling the workpiece from the chucking temperature to the process temperature further comprises providing a heat transfer fluid at a second temperature to the ESC, and wherein heating the workpiece from the process temperature up to the dechucking temperature further comprises providing a heat transfer fluid at the first temperature to the ESC.

7. The method of claim 6, wherein providing the heat transfer fluid at the first and second temperatures further comprises modulating a pulse width modulation (PWM) duty cycle of a first valve through which a cooled fluid flows and a second valve through which a heated fluid flows.

8. The method of claim 6, wherein providing the heat transfer fluid at the first and second temperatures further comprises switching the heat transfer fluid source between a first heat exchanger operating at the first temperature and a second heat exchanger operating at the second temperature.

9. The method of claim 5, wherein the plasma heating comprises energizing a plasma with a bias power to induce ion bombardment of the workpiece.

10. The method of claim 9, wherein heating the workpiece to the chucking temperature further comprises energizing a plasma with both a source power exceeding 1000 W and a bias power under 1000 W.

11. The method of claim 10, wherein heating the workpiece to the dechucking temperature further comprises energizing a plasma with both a source power exceeding 1000 W and a bias power under 1000 W.

12. The method of claim 1, wherein unclamping the workpiece from the ESC further comprises changing a DC voltage applied to the ESC while plasma etching the feature, wherein the voltage change is performed prior to heating the workpiece to the dechucking temperature.

13. The method of claim 1, wherein unclamping the workpiece from the ESC further comprises changing a backside helium pressure applied to the workpiece while plasma etching the feature, wherein the backside helium change is performed prior to heating the workpiece to the dechucking temperature.

14. A non-transitory computer readable storage media with instructions stored thereon, which when executed by a processing system, cause the system to perform the method of claim 1.

15. A non-transitory computer readable storage media with instructions stored thereon, which when executed by a processing system, cause the system to perform the method comprising:
heating a workpiece on an electrostatic chuck (ESC) disposed with a plasma etch chamber to a chucking temperature;
clamping the workpiece to the ESC upon reaching the chucking temperature;
cooling the workpiece from the chucking temperature to a process temperature;
plasma etching a feature into the workpiece while at the process temperature;
heating the workpiece from the process temperature up to a dechucking temperature; and
unclamping the workpiece from the ESC upon reaching the dechucking temperature.

16. The media of claim 15, wherein the process temperature is below 15° C. and both the chucking and dechucking temperatures are above 50° C.

17. The media of claim 15, wherein heating the workpiece to the chucking and the dechucking temperatures further comprises at least one of plasma heating, radiative heating, or conductive heating from the ESC.

18. The media of claim 17, wherein heating the workpiece to the chucking temperature further comprises providing a heat transfer fluid at a first temperature to the ESC, wherein cooling the workpiece from the chucking temperature to the process temperature further comprises providing a heat transfer fluid at a second temperature to the ESC, and wherein heating the workpiece from the process temperature up to the dechucking temperature further comprises providing a heat transfer fluid at the first temperature to the ESC.

19. The media of claim 17, wherein heating the workpiece to the chucking temperature further comprises energizing a plasma with a source power exceeding 1000 W and a bias power under 1000 W, and wherein heating the workpiece to the dechucking temperature further comprises energizing a plasma with a source power exceeding 1000 W and a bias power under 1000 W.

* * * * *